United States Patent [19]

Berra et al.

[11] Patent Number: 5,278,759

[45] Date of Patent: Jan. 11, 1994

[54] SYSTEM AND METHOD FOR REPROGRAMMING VEHICLE COMPUTERS

[75] Inventors: Charles J. Berra, Troy; Alan J. Amici, Dearborn, both of Mich.

[73] Assignee: Chrysler Corporation, Highland Park, Mich.

[21] Appl. No.: 696,900

[22] Filed: May 7, 1991

[51] Int. Cl.$^5$ .............................................. G06F 12/14
[52] U.S. Cl. ........................... 364/424.01; 364/424.04; 365/195
[58] Field of Search ...................... 364/424.01, 424.03, 364/424.04, 431.03, 431.04, 431.12, 551.01; 324/73.1; 340/438, 439; 365/195, 189.1, 189.09, 201, 226; 371/28, ; 395/800, 750

[56] References Cited

U.S. PATENT DOCUMENTS

| | | | |
|---|---|---|---|
| 4,325,130 | 4/1982 | Tiltscher | 395/750 |
| 4,439,804 | 3/1984 | Riddle et al. | 365/195 |
| 4,503,538 | 3/1985 | Fritz | 371/28 |
| 4,551,803 | 11/1985 | Hosaka et al. | 364/431.12 |
| 4,578,774 | 3/1986 | Muller | 365/195 |
| 4,602,127 | 7/1986 | Neely et al. | 364/431.03 |
| 4,675,513 | 6/1987 | Kuze | 365/201 |
| 4,677,558 | 6/1987 | Böhmler et al. | 364/431.03 |
| 4,694,408 | 9/1987 | Zaleski | 364/431.01 |
| 4,706,082 | 11/1987 | Miesterfeld et al. | 340/825.5 |
| 4,719,458 | 1/1988 | Miesterfeld et al. | 340/825.5 |
| 4,739,323 | 4/1988 | Miesterfeld et al. | 340/825.5 |
| 4,739,324 | 4/1988 | Miesterfeld et al. | 340/825.5 |
| 4,742,349 | 5/1988 | Miesterfeld et al. | 340/825.5 |
| 4,791,612 | 12/1988 | Yoshida | 365/195 |
| 4,831,560 | 5/1989 | Zaleski | 364/431.01 |
| 4,853,850 | 8/1989 | Krass, Jr. et al. | 364/424.1 |
| 4,875,391 | 10/1989 | Leising et al. | 74/866 |
| 5,019,799 | 5/1991 | Oshiage et al. | 340/439 |
| 5,047,982 | 9/1991 | Smith et al. | 365/195 |

OTHER PUBLICATIONS

DRBII Diagnostic Tool Operators Manual, Chrysler Motors.
Pashley, Richard D., et al., "Flash Memories: The Best of Two Worlds", Intel Corp. (AR-478) (Dec., 1989).
Miesterfeld, Frederick O., "Chrysler Collision Detection ($C^2D$)—A Revolutionary Vehicle Network" SAE Technical Paper 860389.
Leising, Maurice B., et al. "The All-Adaptive Controls for the Chrysler Ultradrive Transaxle" SAE Technical Paper 890529.

*Primary Examiner*—Gary Chin
*Attorney, Agent, or Firm*—Mark P. Calcaterra

[57] ABSTRACT

A system and method for reprogramming a non-volatile memory of one or more on-board vehicle computers through a serial communication link between an off-board controller and the on-board vehicle computer. An interface circuit is also provided on the vehicle in order to process the command signals from the portable controller which will enable the non-volatile memory to receive and store new computer program code. The method follows a predetermined transfer protocol which assists in preventing the existing computer program code stored in the non-volatile memory from being improperly erased or re-written. This transfer protocol includes the transmission of a command signal from the off-board controller which has a voltage level that exceeds the voltage level of any signal which may recognized on the serial communication link.

16 Claims, 8 Drawing Sheets

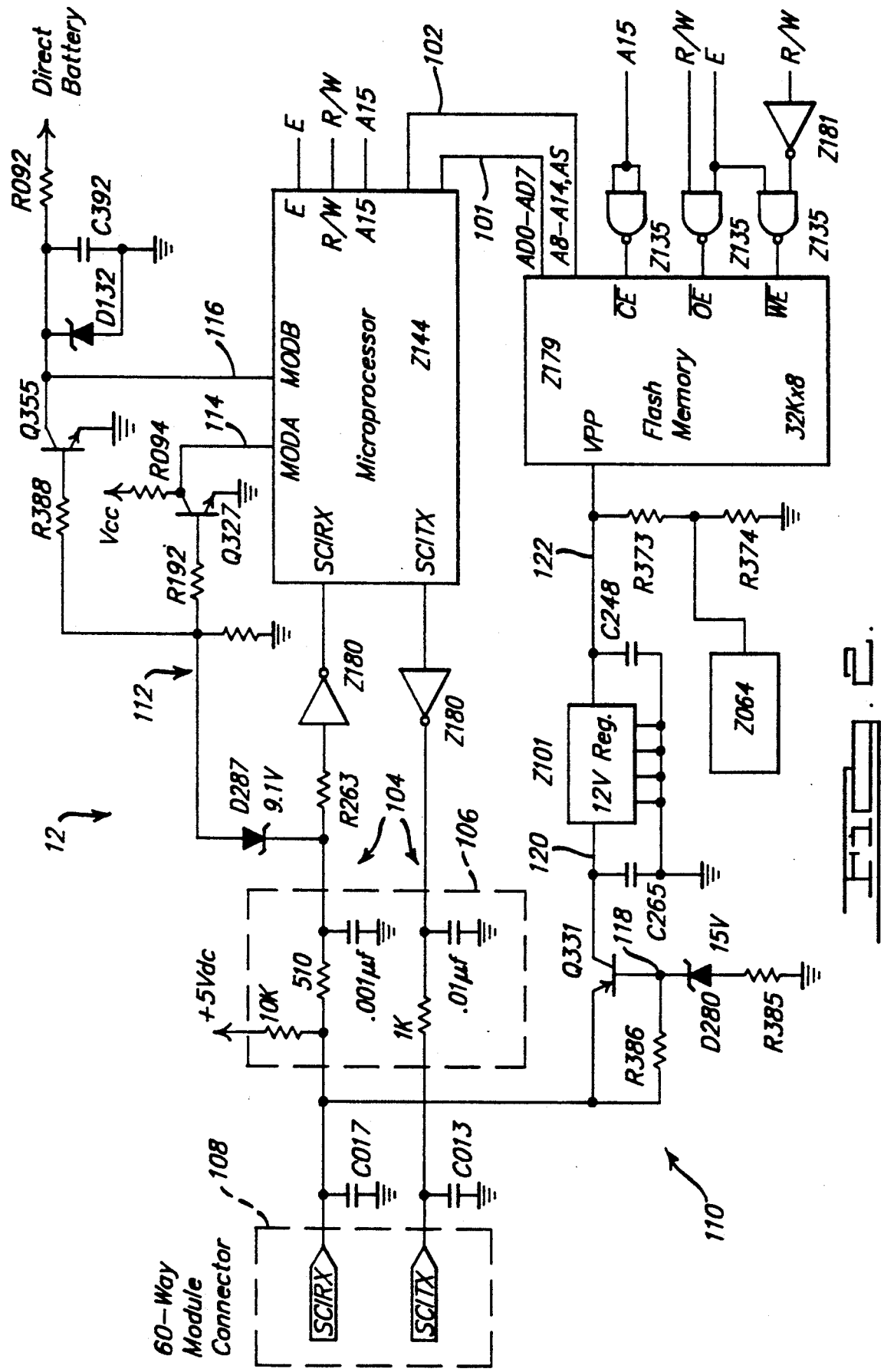

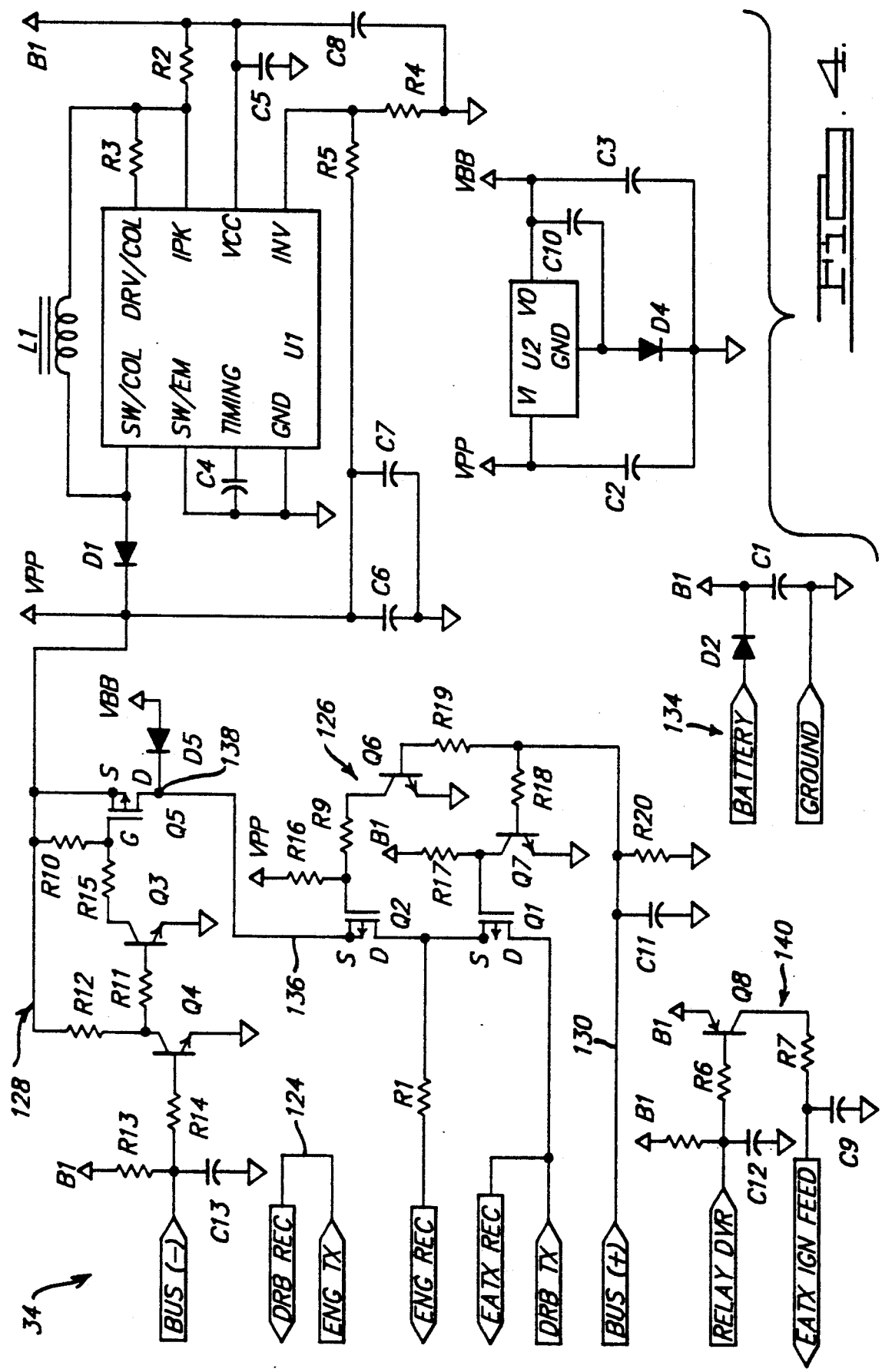

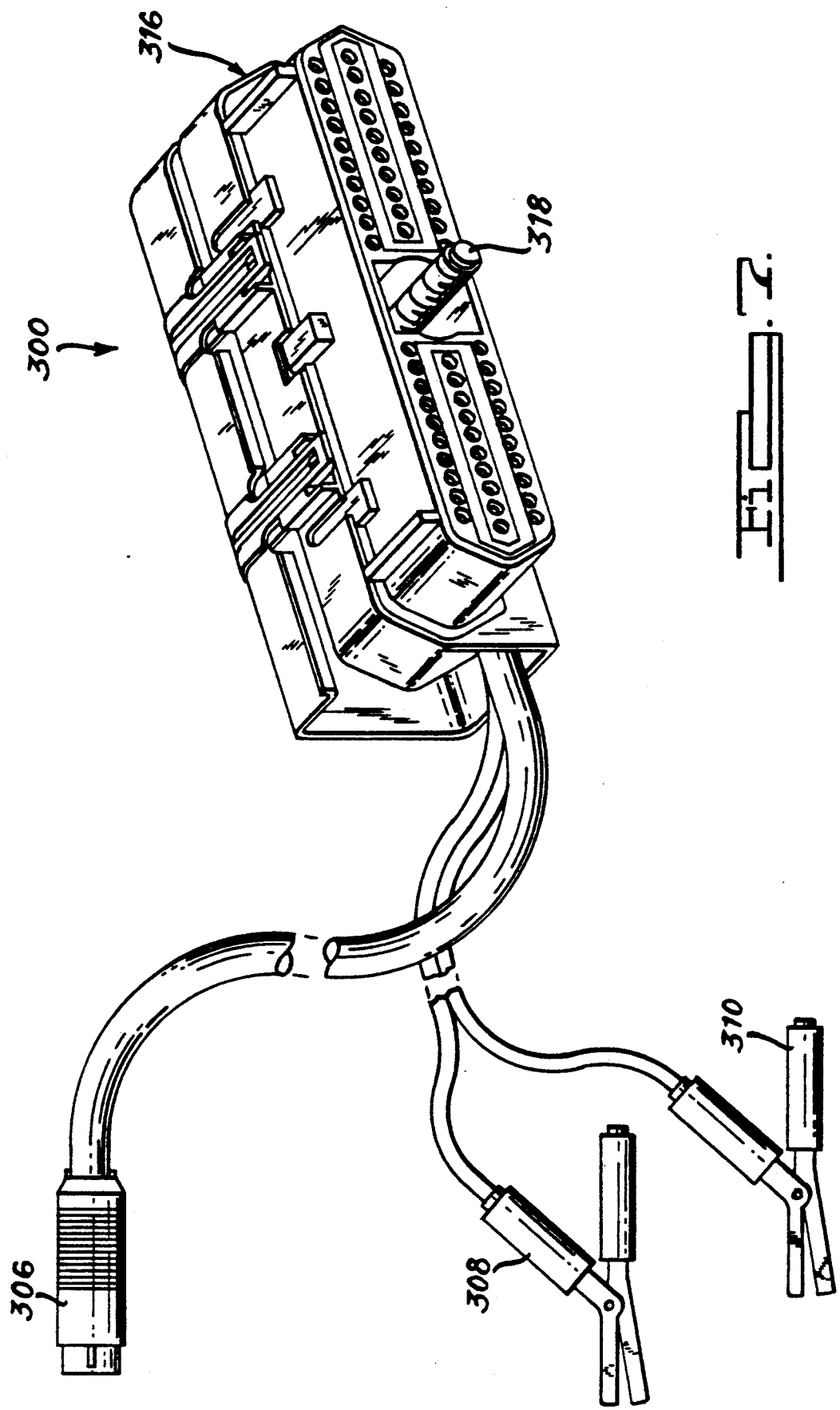

SYSTEM AND METHOD FOR REPROGRAMMING VEHICLE COMPUTERS

BACKGROUND OF THE INVENTION

The present invention generally relates to on-board vehicle computer systems, and particularly to a system and method for reprogramming on-board vehicle computer systems.

For over a decade, computers have been used on vehicles, such as automobiles and trucks, to control particular operations of one or more mechanical vehicle systems. In this regard, one of the first and still principal applications of vehicle computer technology has been to control various aspects of the engine used to drive the vehicle. In recent years, computers have also come to be used in a wide variety of vehicle systems, such as transmission systems, brake systems, suspension systems, operator control panels and even motorized seats. An example of one such computerized vehicle system is described in Leising et. al U.S. Pat. No. 4,875,391, issued on Oct. 24, 1989, entitled "Electronically-Controlled, Adaptive Automatic Transmission System". This commonly assigned patent is hereby incorporated by reference. As described in this patent, the vehicle transmission system includes a computer circuit which controls a plurality of solenoid-actuated valves that regulate the flow of hydraulic fluid within the transmission.

Due to the complexity and inter-relationship between some of these vehicle systems, on-board computer communication systems have also developed to enable data and other signals to be passed between particular vehicle computers. These communication systems typically include a plurality of wires which are connected to the vehicle computers in a particular electronic configuration, generally referred to as a "bus".

One example of an appropriate vehicle bus structure is represented by the Chrysler Collision Detection ("C$^2$D") Serial Data Bus. This technology is described in the following publications and patents: SAE paper No. 860389, entitled "Chrysler Collision Detection (C$^2$D)—A Revolutionary Vehicle Network", by Frederick O. R. Miesterfeld, 1986; SAE paper No. 890529, entitled "The All-Adaptive Controls for the Chrysler Ultradrive Transaxle", 1989; U.S. Pat. No. 4,706,082, entitled "Serial Data Bus For Intermodule Data Communications," which issued on Nov. 10, 1987; and U.S. Pat. No. 4,719,458, entitled "Method of Data Arbitration and Collision Detection In A Data Bus," which issued on Jan. 12, 1988; and U.S. Pat. No. 4,739,323, entitled "Serial Data Bus For Serial Communication Interface (SCI), Serial Peripheral Interface (SPI) and Buffered SPI Modes of Operation," which issued on Apr. 19, 1988; and U.S. Pat. No. 4,739,324, entitled "Method for Serial Peripheral Interface (SPI) in a Serial Data Bus," which issued on Apr. 19, 1988; and U.S. Pat. No. 4,742,349 entitled "Method for Buffered Serial Peripheral Interface (SPI) in a Serial Data Bus", which will issue on May 3, 1988. These co-assigned patents and the identified publications are all hereby incorporated by reference.

In this regard, it should be noted that the engine controller and the transmission controller discussed in the above referenced U.S. Pat. No. 4,875,391 are both connected to the C$^2$D Serial Data Bus. This Serial Data Bus may also be accessible to off-board vehicle computers through one or more diagnostic connectors on the vehicle. In this regard, it should be appreciated that any vehicle bus structure needs to be accessible to off-board computer systems in order to permit the bus itself to be tested and permit direct access to and communication with any of the vehicle computers tied to the vehicle bus.

One or more of these vehicle diagnostic connectors also typically provide separate communication links or channels with both the vehicle's engine control computer and the vehicle's transmission control computer. These communication links are generally designed to conduct serial communications directly with these particular on-board vehicle computers during certain diagnostic procedures.

In any event, diagnostic connectors have been employed since engine computers were first used on vehicles to permit communication between on-board and off-board computers. Thus, for example, data being gathered by the on-board vehicle computer from various sensors (such as engine speed and manifold pressure) may be transmitted to an off-board computer for programmed or operator analysis. Additionally, it may be desirable for an off-board computer to transmit commands which will actuate or energize electronically controlled devices on the vehicle (such as the air switch solenoid) to examine the response achieved. As another example of possible forms of communication, it may be advantageous for a test program from an off-board computer to be "down-loaded" into the transmission control computer in order to execute one or more prescribed tests of the transmission system before the vehicle leaves the manufacturing facility.

As with any computer system, an on-board vehicle computer cannot function without a set of instructions for the computer hardware to follow. This set of instructions may comprise one or more computer programs which are sometimes referred to generically as computer software. In order for the computer hardware to use this set of instructions, the computer programs need to be stored in some medium which is readily accessible to the computer's hardware. In terms of on-board vehicle computers, the computer programs are typically stored in a form of circuitry which will retain the computer program even when there is no electrical power connected to the computer circuit.

Specifically, on-board vehicle computer programs are stored in one or more types of non-volatile ROM, which stands for "Read-Only Memory". ROM circuits come in various types, such as permanent circuits (ROM), programmable circuits (PROM), erasable-programmable circuits (EPROM) or electrically erasable-programmable circuits (EEPROM). Each of these ROM circuits are produced in the form of a semiconductor integrated circuit (IC) or circuit "chip" which may be separately mounted to a circuit board or contained in a larger chip that includes other circuits as well.

With a permanent ROM, the computer programs are hard-wired into the chip during the manufacture of the chip, and the program cannot be changed. With a PROM, the computer program is electronically inserted or injected into the chip after it has been manufactured. The EPROM is like a PROM except it has the added capability of erasing the entire computer program stored in the chip by irradiating the chip with ultra-violet light for a period of time on the order of 20 minutes. Once the program is erased, then another computer program may be inserted into the chip to take its place. The EEPROM is similar to the EPROM in that it permits erasure and subsequent re-programming. However, with an EEPROM, the entire computer program need not be erased, and the erasure may be accomplished very rapidly (e.g., 1-2 seconds) through the application of electrical signals.

Additionally, a new form of non-volatile ROM chip, known as a "flash memory", has also become available. A flash memory chip is like an EEPROM in terms of being electrically erasable and re-programmable. However, unlike an EEPROM, individual memory cells cannot be erased in a flash memory chip. At the present time, a flash memory only has the capability of erasing selected sections of the memory or the entire contents of the memory. Nevertheless, a flash memory has several advantages over EEPROMs, including high density and the ability to operate at a low voltage (e.g., 5 volts). A further description of flash memories may be found in an IEEE Spectrum article by Pashley et. al., entitled "Flash memories: the best of two worlds", December, 1989. This article is hereby incorporated by reference.

As will be appreciated from the above discussion of ROM memories, each of these memory types present different options when it is desired to update, revise or expand upon the computer programs which are stored in the memory chip. With permanent ROMs and PROMs, the chip itself has to be removed from the circuit board and replaced with a new memory chip which contains the desired computer programs. With an EPROM, the memory chip still needs to be removed from the circuit board in order to be erased. However, the EPROM chip may then be replaced on the circuit board after the new program has been injected into the chip.

Due to the amount of time, labor and possible replacement costs involved in these procedures, none of these three types of ROM chips present particularly attractive options for applications where it may be desirable to periodically update the software stored on the memory chip. In contrast, EEPROMs and flash memories do offer a potentially viable option for updating or otherwise replacing existing software. In this regard, it is generally not necessary for a EEPROM or flash memory chip to be removed from a circuit board in order to erase all or part of a computer program and subsequently re-program the appropriate memory cells. Additionally, as discussed above, the entire erasure/re-programming procedure for these memory chips may be carried out very quickly.

With respect to the computer programs used in on-board vehicle computer systems, a need exists to provide a way which will permit these computer programs to be easily updated or changed at a qualified dealership. As each model year brings further sophistication to on-board vehicle computer systems and their computer programs, it would be a distinct benefit to the consumer to permit one or more of the vehicle computers to be upgraded with the latest software on an economical basis.

Accordingly, it is a principal objective of the present invention to provide a secure system and method for reprogramming on-board vehicle computers.

It is a more specific objective of the present invention to provide a secure system and method for reprogramming on-board vehicle computers which is reliable, quick and economical.

It is another objective of the present invention to provide a secure system and method for reprogramming on-board vehicle computers which minimizes the amount of hardware changes required to reprogram all or part of computer programs residing in an on-board memory chip.

It is a further objective of the present invention to provide a secure system and method for reprogramming on-board vehicle computers which utilizes the existing vehicle communication structure for transmitting new computer instructions to the on-board memory chip being reprogrammed.

SUMMARY OF THE INVENTION

To achieve the foregoing objectives, the present invention provides a system and method for reprogramming the non-volatile memory of one or more on-board vehicle computers through a communication link between an off-board controller and the signal transfer structure of the vehicle. An interface circuit is also provided on the vehicle in order to process the command signals from the portable controller which will enable the non-volatile memory to receive and store new computer program code. In one form of the present invention, the reprogramming method follows a predetermined transfer protocol which assists in preventing the existing computer program code stored in the non-volatile memory from being improperly erased or re-written. For example, this transfer protocol includes the transmission of a command signal from the off-board controller which has a voltage level that exceeds the voltage level of any power supply available on the vehicle or any signal which may recognized on the vehicle signal transfer structure.

In one form of the present invention, the off-board controller is comprised of a diagnostic tool which includes a portable housing, a computer based control circuit contained in the housing and a plug-in memory module which is removably secured to the portable housing. The plug-in memory module includes one or more non-volatile memory chips which store the new computer code and the predetermined transfer protocol instructions. The communication link between the diagnostic tool and the vehicle signal transfer structure is provided by a cable structure that includes an in-line adapter for providing the voltage level required for at least one of the command signals. The cable structure is removably connected to the diagnostic connector of the vehicle which provides access to the vehicle signal transfer structure.

Under the method according to the present invention, the on-board vehicle computer is first initialized into a bootstrap mode, and then a program is downloaded from the diagnostic tool to identify the on-board vehicle flash memory manufacturer and version of the computer program code currently residing in the non-volatile memory. Once it is determined that it is appropriate to reprogram this non-volatile memory with the computer program code contained in the plug-in module of the diagnostic tool, the existing computer program code in the non-volatile memory of the on-board vehicle computer is preferably erased. In one form of the present invention, a unique command signal is required to permit the erasure to proceed. This particular command signal is processed by the interface circuit on the vehicle to ultimately generate a reprogramming signal voltage level which is otherwise available on the vehicle. After the existing computer program code is erased, then the new computer program code from the plug-in module is immediately transmitted to the non-volatile memory of the on-board computer circuit via the communication link with the vehicle's signal transfer structure and the on-board computer.

Additional features and advantages of the present invention will become more fully apparent from a reading of the detailed description of the preferred embodiment and the accompanying drawings in which:

BRIEF DESCRIPTION OF THE DRAWINGS

FIG. 2 is a schematic diagram of a portion of the vehicle engine controller shown in FIG. 1, which particularly illustrates the non-volatile flash memory and the interface circuit according to the present invention.

FIG. 4 is a schematic diagram of the adapter which forms part of the serial communication link shown in FIGS. 1 and 3.

FIGS. 6A–B provide a flow chart of the computer program instructions which follow the transfer protocol according to the method of the present invention.

FIG. 7 is a perspective view of a wiring harness which forms part of the serial communication link when the non-volatile flash memory of the transmission controller is to be reprogrammed.

DETAILED DESCRIPTION OF THE PREFERRED EMBODIMENTS

Figure 1:
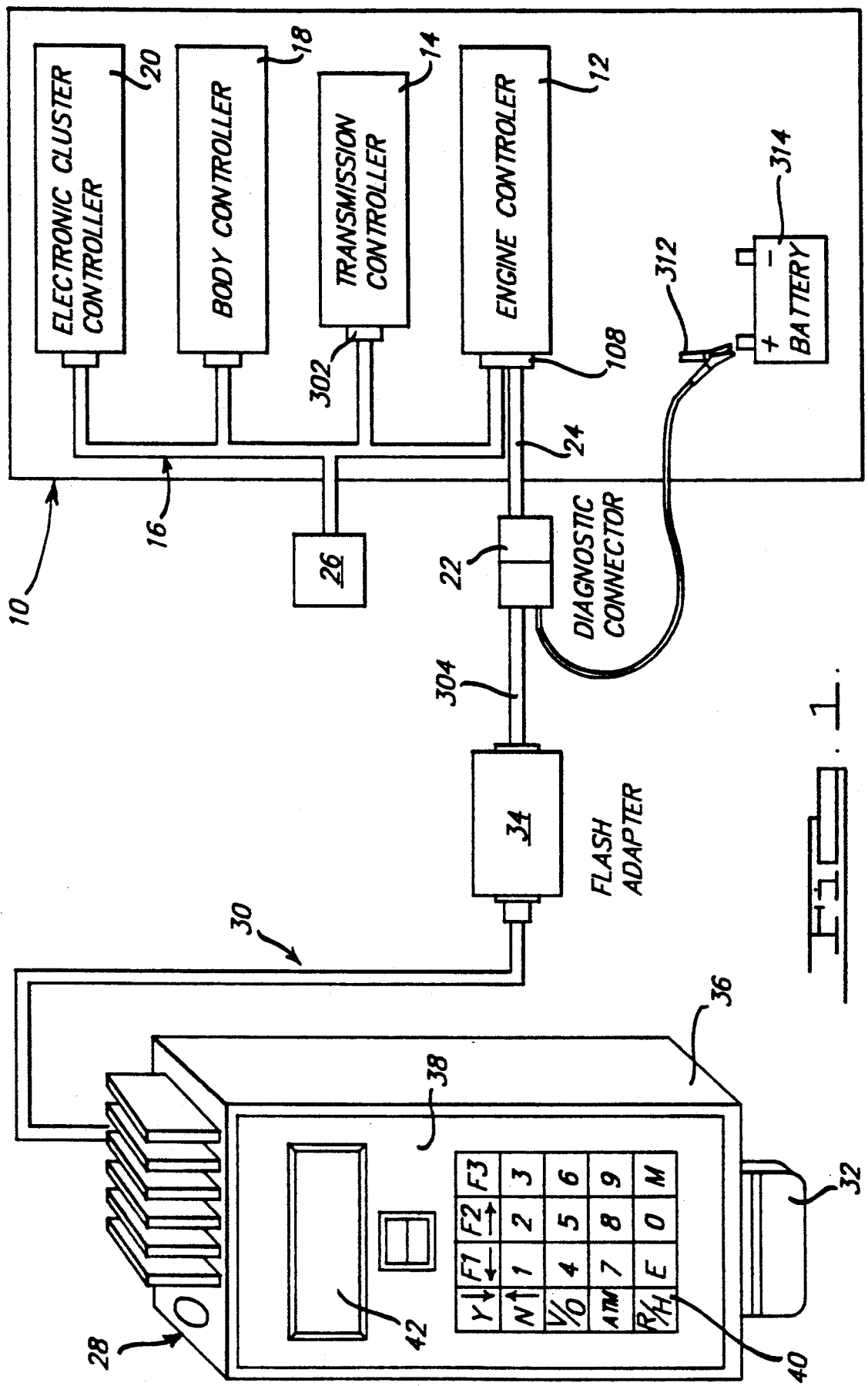
FIG. 1 is a diagrammatic representation of a portable diagnostic tool and serial communication link that may be utilized to reprogram the non-volatile memory of a vehicle engine controller according to the method of the present invention.

Referring to FIG. 1, a vehicle 10 is shown generally as a large block. The vehicle 10 includes a plurality of on-board vehicle computer circuits, such as an engine controller 12 and an automatic transmission controller 14. Each of these on-board vehicle computer circuits or controllers are connected to a vehicle signal transfer structure 16, which could include, for example, the Chrysler Collision Detection Serial Data Bus discussed above. The signal transfer structure 16 may also include individual serial communications links to on-board vehicle computer circuits that are not part of a shared or common bus structure for all on-board vehicle computer circuits. In any event, it should be appreciated that a variety of suitable vehicle signal transfer structures may be employed to permit communication with computer circuits on the vehicle 10, and that the principles of the present invention are not limited to any particular vehicle signal transfer structure. Additionally, while the invention will be described in connection with the engine controller 12 and the transmission controller 14, it should be appreciated that the non-volatile memories of other suitable on-board computer circuits may be reprogrammed in the appropriate application, such as the non-volatile memory of the body controller 18 or the electronic instrument cluster 20.

FIG. 1 also shows a diagnostic connector 22 which is connected to the engine controller 12 through the vehicle signal transfer structure 16. The diagnostic connector 22 includes electrical conduits which lead directly and only to the engine controller 12. In this regard, the cable 24 leading from the diagnostic connector 22 to the signal transfer structure 16 provides an individual serial communication channel between the engine controller 12 and an off-board computer. While on-board non-volatile memories are preferably reprogrammed through such individual serial communication channels, it should be appreciated that a non-volatile memory of an on-board vehicle computer may be reprogrammed by utilizing the vehicle's shared bus structure, where suitable communication circuitry is provided. In this regard, it should be noted that FIG. 1 shows a body diagnostic connector 26 which is connected to the $C^2D$ bus of the vehicle signal transfer structure 16. While the body diagnostic connector 26 is not presently used for reprogramming non-volatile memories of the on-board vehicle computer, this diagnostic connector does provide access to the vehicle's shared bus structure.

FIG. 1 also shows a diagnostic tool 28 which is connected to the diagnostic connector 22 through a cable structure 30. The diagnostic tool 28 provides an off-board control unit which is capable of transmitting reprogramming signals to an on-board vehicle computer circuit through the cable structure 30. In this particular embodiment, the diagnostic tool 28 is a DRB II Diagnostic Readout Box that is commercially available to Chrysler dealerships. The diagnostic tool 28 also includes a plug-in module 32 which is removably secured to the diagnostic tool. As will be shown in FIG. 5, the plug-in module 32 includes one or more non-volatile memory chips which store the new computer program code to be transmitted to the non-volatile memory of the on-board vehicle computer circuit being reprogrammed, and the computer programs which control the reprogramming process according to the present invention. The computer programs used in this reprogramming process will be described in connection with the flow chart of FIG. 6.

While the DRB II unit provides an advantageous off-board controller for transmitting reprogramming signals to an on-board vehicle computer circuit, it should be appreciated that other suitable off-board controllers may be used in the appropriate application. In this regard, it should be appreciated that the use of a DRB II unit provides a relatively inexpensive hardware platform for controlling the reprogramming process according to the present invention. Additionally, it should be noted that no physical or circuit modifications to existing DRB II units are required to conduct the reprogramming process of the invention. As the DRB II unit is already configured to permit serial communication with the vehicle signal transfer structure 16, the necessary computer program instructions to carry out the process may be stored in the plug-in module 32. Thus, it is envisioned that there may be a plurality of plug-in modules 32, each of which would contain the new computer program code for specific vehicle model years and types.

In order to avoid any circuit modifications to the DRB II unit, the cable structure 30 is uniquely constructed to include an in-line adapter circuit which is generally designated by the flash adapter block 34 in FIG. 1. As will be more fully appreciated from the description below, the adapter circuit 34 includes switching circuits and regulator circuits for converting certain specific command signals from the diagnostic tool 28 to command signals having predetermined voltage levels.

While the communication link between the diagnostic tool 28 and the vehicle 10 is shown in FIG. 1 to be provided by cable structure 30, it should be appreciated that other suitable forms of communication may be provided in the appropriate application. Thus, while the cable structure 30 provides a physically connectable communication link, other means of communication could be utilized that do not provide a physical connection. Thus, for example, it may be possible to provide a radio or infrared communication link between the diagnostic tool 28 and the vehicle 10 with the appropriate communication circuitry.

As shown in FIG. 1, the DRB II unit includes a portable housing 36 which may be hand held near or in the vehicle 10 by the service technician. The front panel 38 of the DRB II unit includes a keypad 40 for entering data or instructions in an interactive communication process with the DRB II unit. In this regard, the DRB II unit includes a display 42 which is capable of visibly displaying several lines of character and numeric information. Thus, for example the DRB II unit may prompt the service technician to enter particular information from the keypad 40 by producing a specific request on the display 42. Accordingly, when the service technician secures the plug-in module 32 to the housing 36 of the DRB II unit, the first request presented on display 42 may be a request to confirm that the service technician wishes to initiate the reprogramming process.

Referring to FIG. 2, a schematic diagram of the portion of the engine controller 12 is shown. In this regard, FIG. 2 particularly illustrates the connection between a flash memory chip Z179 and a microprocessor chip Z144, and the use of an interface circuit to process command signals received from the diagnostic tool 28. In this particular embodiment, the non-volatile memory is shown to be comprised of a single flash memory chip, identified in the figure as flash memory chip Z179. However, it should be appreciated that the on-board vehicle computer circuit may include a plurality of non-volatile memory chips in the appropriate application. Additionally, while the flash memory chip Z179 is externally connected to the microprocessor chip Z144 in the engine controller 12, it should be appreciated that it may be desirable to provide a non-volatile memory which is integrated into a single integrated circuit chip with the microprocessor circuitry. Additionally, while the engine controller 12 utilizes a flash memory as the form of non-volatile memory in the on-board vehicle computer circuit, it should be understood that other suitable forms of electrically erasable, programmable non-volatile memories may be used in the appropriate application, such as a EEPROM.

As may be seen in FIG. 2, the flash memory chip Z179 is connected to the microprocessor chip Z144 through an address/data bus 101 (AD0-AD7), and an address bus 102 (A8-A14). The flash memory chip Z179 is also connected to the microprocessor chip Z144 through a plurality of control lines (E, R/W, A15), and a set of logic gates (NAND gates Z135, and invertor gate Z181). Thus, for example, control line A15 forms part of the address bus of the microprocessor chip Z144, and this particular line is used to enable the flash memory chip Z179 to receive signals from the other control lines. In this regard, it will be appreciated that the R/W control line will provide a signal for causing the flash memory chip Z179 to enter either a write mode or read mode. Similarly, the E control line is used to provide a clock signal to the flash memory chip Z179 from the microprocessor chip Z144. In this particular embodiment, the microprocessor chip Z144 is a Motorola 68HC11 microprocessor and the flash memory chip Z179 is a Toshiba 32Kx8 flash memory. However, it should be appreciated that other suitable microprocessor and flash memory chips may be utilized in the appropriate application.

As shown in FIG. 2, the microprocessor chip Z144 is connected to a serial communication channel which is generally designated by the reference numeral 104. The serial communication channel 104 is generally comprised of a transmit line labeled "SCITX" and a receive line labeled "SCIRX". Each of these transmit and receive lines include a RC filter generally designated by the dashed block 106 and a buffering invertor Z180. This serial communication channel extends out to a 60-way module connector 108, which includes many other lines (not shown) for transmitting signals to and from the engine controller 12. The module connector 108 is connected to the signal transfer cable 24 shown in FIG. 1.

As indicated above, FIG. 2 also illustrates an interface circuit for processing command signals from the diagnostic tool 28. This interface circuit is generally comprised of two separate interface sections, which are generally designated by reference numerals 110 and 112 respectively. Each of these interface sections include a line connected to the SCIRX receive line of the serial communication channel 104. However, the output of interface section 110 is connected to the flash memory chip Z179, while the output of the interface section 112 is connected to the microprocessor chip Z144. Each of these interface sections 110-112 are used to detect and process a particular command signal from the diagnostic unit 28.

Referring first of interface section 112, this circuit is used to detect and process a 12-volt bootstrap command signal from the diagnostic unit 28. This 12-volt bootstrap command signal is used to initiate a bootstrap mode within the microprocessor chip Z144 as an initial step under the method according to the present invention. In this regard, the 12-volt bootstrap command signal is sent to the vehicle 10 via the serial communication channel 104 when the engine ignition is off. Subsequently, when the ignition is turned on, the microprocessor chip Z144 will "wake up" in the bootstrap mode. In the bootstrap mode, the microprocessor chip Z144 will execute a bootloader program and look for data on the SCIRX receive line, rather than receive the instructions previously stored in the flash memory chip Z179. In this way, control of the microprocessor chip Z144 is turned over to the computer program instructions stored in the plug-in module 32 of the diagnostic tool 28; whereas, the microprocessor chip Z144 would normally receive its instructions from the computer program stored in the flash memory chip Z179.

The interface section 112 includes a Zener diode D287 which is connected to the SCIRX line of the serial communication channel 104. The Zener diode D287 is used as a threshold device to detect the presence of the 12-volt command signal, as the voltage level of this particular command signal will exceed the breakdown voltage (9.1 volts) of the Zener diode. Once the breakdown voltage of the Zener diode D287 is exceeded, the 12-volt bootstrap command signal will be transmitted simultaneously to the base junctions of transistors Q327 and Q355. This command signal will cause both transistors Q327 and Q355 to turn on at the same time. With the collector junction output from transistor Q327 connected to the MODA port of the microprocessor chip Z144, the presence of the 12-volt command signal will cause the signal on line 114 to switch from a digitally HI state (Vcc=5 volts) to a digitally LO state (ground). Similarly, the presence of the 12-volt command signal will cause the voltage level on line 116 to switch from its normal battery voltage level state to a ground potential. Accordingly, it should be appreciated that the 12-volt bootstrap command signal causes both ports MODA and MODB of the microprocessor chip Z144 to simultaneously be tied to a ground potential (e.g., 0 volts). Thus, it should be appreciated that the interface section 112 detects the 12-volt command signal and causes two voltage input ports of the microprocessor chip Z144 to receive voltage levels which the microprocessor chip will interpret as a request to initiate the boot strap mode. When the 12-volt bootstrap command signal is not present on the SCIRX receive line, the pull up resistor R094 will cause the MODA port of the microprocessor chip Z144 to receive the voltage level of Vcc. Similarly, the connection of pull up resistor R092 between line 116 and the vehicle battery will cause the MODB port of the microprocessor chip Z144 to receive a voltage level that is clamped to 5.1 volts by zener diode D132 when the 12-volt command signal is not present. Accordingly, the interface section 112 effectively processes the 12-volt bootstrap command signal by effectively producing two responsive signals which are transmitted to the microprocessor chip Z144.

The interface section 110 generally includes a transistor Q331, a Zener diode D280, and a regulator chip Z101. The emitter junction of the transistor Q331 is connected to the SCIRX receive line of the serial communication channel 104, while the Zener diode D280 is connected in series with resistor R385 between the base junction of the transistor and ground. A resistor R386 is also coupled between the SCIRX receive line and the base junction of the transistor Q331 (i.e., at node 118). In this configuration, any signals that may be present on the SCIRX receive line will be transmitted to the interface section 110, and specifically to node 118 of this interface section. However, the transistor Q331 will not turn on until the signal on the SCIRX receive lines exceeds the 15 volt breakdown voltage of the Zener diode D280. Accordingly, it should be appreciated that the interface section 110 is designed to detect a signal which exceeds the 15 volt threshold. Specifically, the interface section 110 is used to receive a reprogramming signal having a voltage of approximately 19-21 volts (nominally 20 volts). In this regard, it should be noted that the voltage level of the reprogramming signal significantly exceeds the voltage level of the vehicle's battery, and preferably exceeds the voltage level of any power supply on the vehicle. In any event, the voltage level of the programming signal (or other suitable electrical parameter) should be such that this reprogramming signal is unique among the signals that may be present on the SCIRX receive line.

When the reprogramming signal is present on the SCIRX receive line, the transistor Q331 will conduct or turn on and permit the voltage level of this signal to be applied to the regulator Z101 via line 120. The regulator Z101 is designed to produce a very precise 12-volt output signal which is communicated to the Vpp port of the flash memory chip Z179 via line 122. The presence of the 12-volt output signal from the regulator Z101 will unlock the flash memory chip Z179 and enable the microprocessor chip Z144 to read the identity of the manufacturer of the flash memory chip. The presence of the reprogramming signal will also subsequently permit the existing computer programs stored in the flash memory chip to be erased. Thus, it should be appreciated that even though the flash memory chip Z179 may be controlled by the application of a 12-volt signal, the interface section 110 of the present invention requires the presence of a unique signal before the 12-volt voltage level will be applied to the flash memory chip. It should also be noted that FIG. 2 shows a 68HCO5C4 coprocessor chip Z064 which is connected to the output line 122 of the regulator Z101 through the voltage divider provided by resistors R373 and R374. This coprocessor chip Z064 is used in this particular instance to sense the presence or absence of the 12-volt voltage level at the VPP port of flash memory chip Z179 for diagnostic purposes.

Figure 3A:
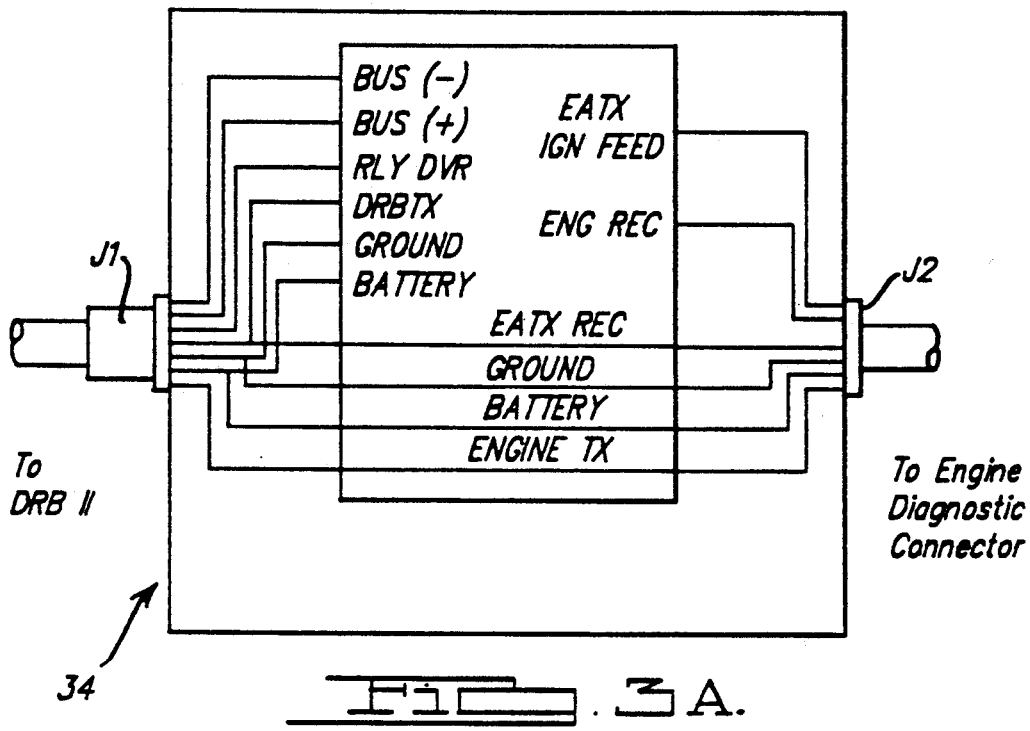
FIG. 3A is a block diagram of the adapter for the serial communication link shown in FIG. 1, and FIGS. 3B–3C provide an end view of the adapter connectors.
Figures 3B, 3C:
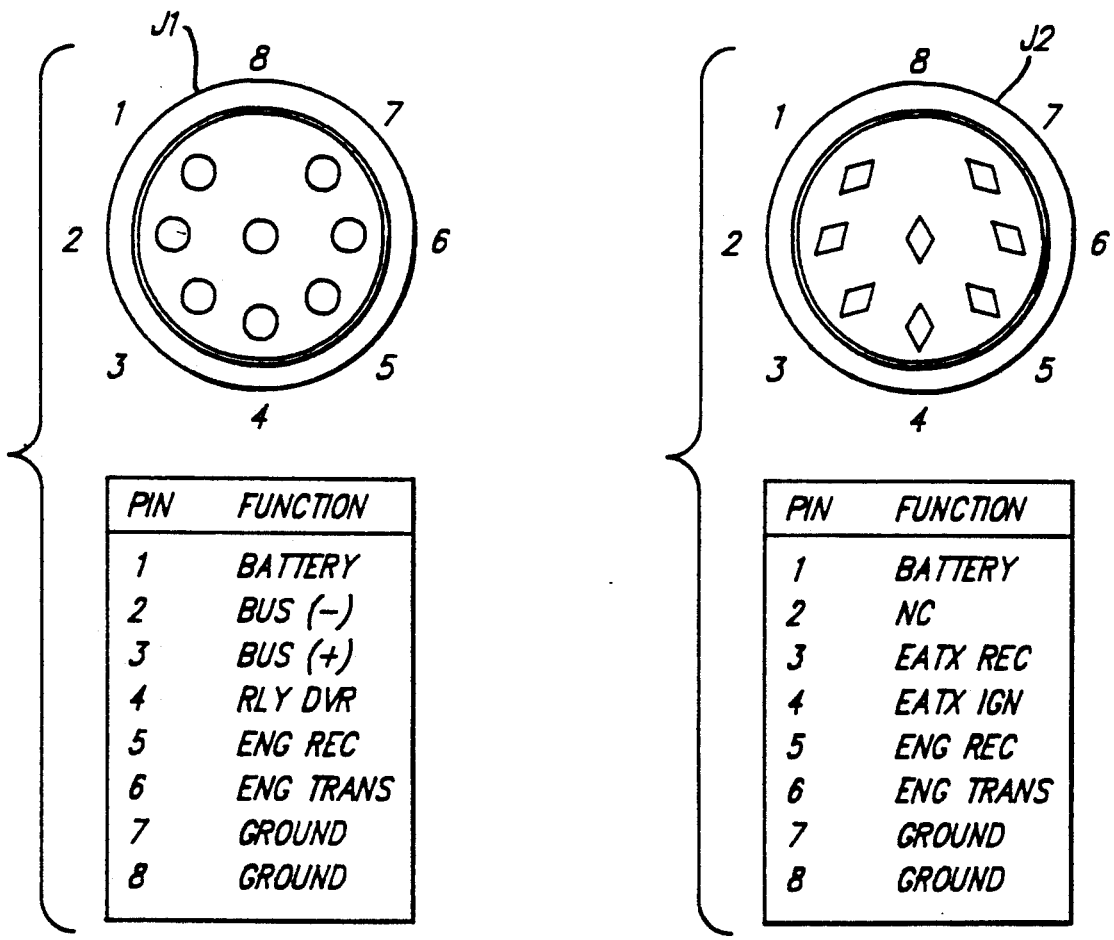

Referring to FIG. 3A, a block diagram of the flash adapter block 34 is shown. In this regard, FIG. 3A illustrates that the flash adapter block 34 includes a connector J1 at one end which is coupled through a cable to the diagnostic tool 28, and a connector J2 at the opposite end which is coupled through a cable to the diagnostic connector 22 of the vehicle 10. FIGS. 3B-3C also illustrate an end view of each of the J1-J2 connectors and provide a table which identifies the pins for each of these connectors. While FIG. 3A also illustrates the flash adapter circuit 34 in block form, the flash adapter circuit block 34 does illustrate a direct connection between the connectors J1-J2 for the EATX receive line, the ground line, the battery line, and the engine transmit line. Accordingly, it should be appreciated that the adapter circuit 34 is specifically controlled by the signals transmitted from the diagnostic tool 28 on the BUS(−), BUS(+), and relay driver line.

Referring to FIG. 4, a schematic diagram of the flash adapter circuit 34 is shown. In this regard, it should be noted that FIG. 4 illustrates each of the lines contained in the cable structure 30 with an identification of the specific connector pin for each line. Thus, for example, the DRB receive line from pin 6 of the connector J1 is shown to be directly connected to the engine transmit line of pin 6 for connector J2 via line 124. The ENG TX line shown in FIG. 4 corresponds to the SCITX line shown in FIG. 2. Similarly, the ENG REC line shown in FIG. 4 corresponds to the SCIRX line shown in FIG. 2.

The flash adapter 34 generally includes a communication switching circuit 126, a voltage level switching circuit, a switching regulator U1 and a precision regulator U2. The communication switching circuit 126 is used to determine whether normal SCI communication is to be enabled between the diagnostic tool 28 and the vehicle 10, or whether command signals from the diagnostic tool 28 are to be transmitted to the vehicle 10. The operation of the switching circuit 126 i controlled by the signal on the BUS(+) line 130. In this regard, when the control signal on line 130 is LO (0 Vdc), normal SCI communication is enabled from the diagnostic tool 28 to the SCIRX receive line of the engine controller 12 and the EATX receive line of the transmission controller 14. This is because the field effect transistor ("FET") Q1 will be in a conducting condition due to the bias voltage supplied through pull up resistor R17. In this regard, it should be appreciated that the biasing voltage B1 is derived from the battery voltage of the vehicle, as shown by the power supply circuit 134 of FIG. 4.

When the control signal on line 130 is switched to a digital HI state (5 Vdc), SCI communication from the diagnostic tool 28 is disabled. In this regard, the HI control signal on line 130 will cause the transistors Q7 and Q6 to conduct. The conduction of transistor Q7 will cause the transistor Q1 to turn off and effectively disconnect the SCIRX receive line of the engine controller 12 from the DRB transmission line of the diagnostic tool 28. In contrast, the conduction of transistor Q6 will cause a transistor Q2 to turn on and effectively couple the SCIRX line to the line 136. Line 136 is connected to a node 138 which acts in the capacity of an OR gate, as will be described below. In this regard, the voltage at node 138 will either be the voltage level of voltage source VPP or voltage source VBB. The voltage level at node 138 is determined by a control signal on the BUS(−) line. When the control signal on the BUS(−) line is digitally LO, a transistor Q5 will conduct and apply the voltage level from voltage source VPP to the node 138. When the control signal on the BUS(−) line is digitally HI, the transistor Q4 will conduct and cause a transistor Q3 to turn off. When transistor Q3 turns off, the proper biasing voltage will be transmitted through resistor R10 to the gate junction of transistor Q5 in order to turn this transistor off. When transistor Q5 is nonconductive or off, then the voltage level from the voltage source VBB will be transmitted through the diode D5 to the node 138.

The voltage level of voltage source VBB is derived from the regulator U2, while the voltage level of the voltage source VPP is derived from the regulator U1. In this regard, the regulator U1 receives the battery voltage level B1, and this regulator converts the voltage level B1 to the voltage level for voltage source VPP. The voltage source VPP is also applied to the regulator U2 to create a precise or regulated voltage level for voltage source VBB. In this regard, it should be appreciated that the voltage level of voltage source VBB is 12 volts, and accordingly this voltage level is used for the 12-volt bootstrap command signal. Similarly, the voltage level of the voltage source VPP is used for the 20 volt reprogramming command signal.

The third control line, labeled relay driver, from the diagnostic tool 28 is used only in connection with reprogramming the non-volatile memory contained in the transmission controller 14. In this regard, FIG. 4 also shows a switching circuit 140 which generally comprises a transistor Q8 which will turn on and conduct the battery level voltage B1 to the EATX ignition feed line of the transmission controller 14.

Figure 5:
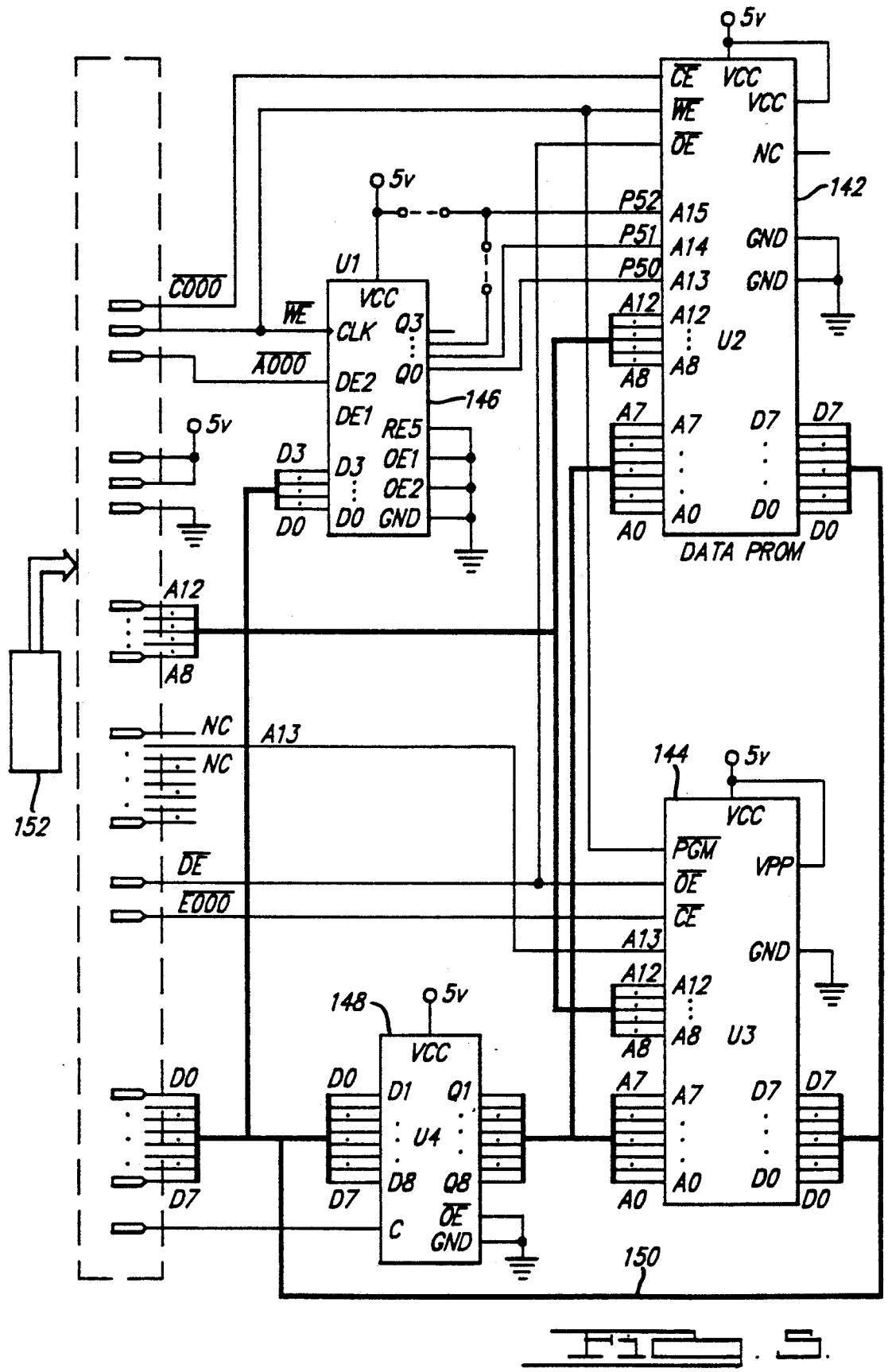
FIG. 5 is a schematic diagram of the plug-in module of the diagnostic tool shown in FIG. 1.

Referring to FIG. 5, a schematic diagram of the plug-in module 32 is shown. The plug-in module 32 includes a first EPROM 142 which contains the exact computer program code that is to be downloaded from the diagnostic tool 28 to the non-volatile memory of the appropriate on-board vehicle computer circuit. This particular EPROM chip preferably has the same storage density (e.g., 32Kx8 or 64Kx8) as the non-volatile memory contained in the on-board vehicle computer circuit. The plug-in module 32 also includes another EPROM, identified by reference numeral 144, which contains the software necessary to reprogram the non-volatile memory of the on-board vehicle computer circuit. Accordingly, EPROM 144 contains the operating system for the diagnostic unit 28 and the algorithms necessary to reprogram the on-board non-volatile memory. This particular EPROM will also include a table of part numbers that the new computer program code will supersede. As part of the reprogramming method according to the present invention, reprogramming will not be allowed unless the part number of the on-board vehicle computer circuit is listed in the table stored in the EPROM 144. Thus, for example, in the case of the engine controller 12, the part number will provide a precise indication of the type of engine involved and the version of the software currently stored in flash memory Z179. In this regard, it should be noted that this part number is preferably stored in the internal EEPROM memory of the microprocessor chip Z144. It should also be noted that either or both of the EPROMs contained in the plug-in module 32 may be comprised of any suitable non-volatile memory device, such as a flash memory. Additionally, it may be possible to also combine the functions of these two EPROMs into a single memory device in the appropriate application.

FIG. 5 also shows that the plug-in module 32 includes a D-type flip flop circuit 146 which receives signals from data lines D0-D3. This circuit is used to select one of four 8k pages of information from EPROM 142. The plug-in module 32 also includes a latch circuit 148 which is also coupled to the address/data BUS 150 of the computer circuit 152 contained in the diagnostic tool 28. This circuit is used to latch low order address information from the multiplexed address/data bus 150.

Figure 6A:
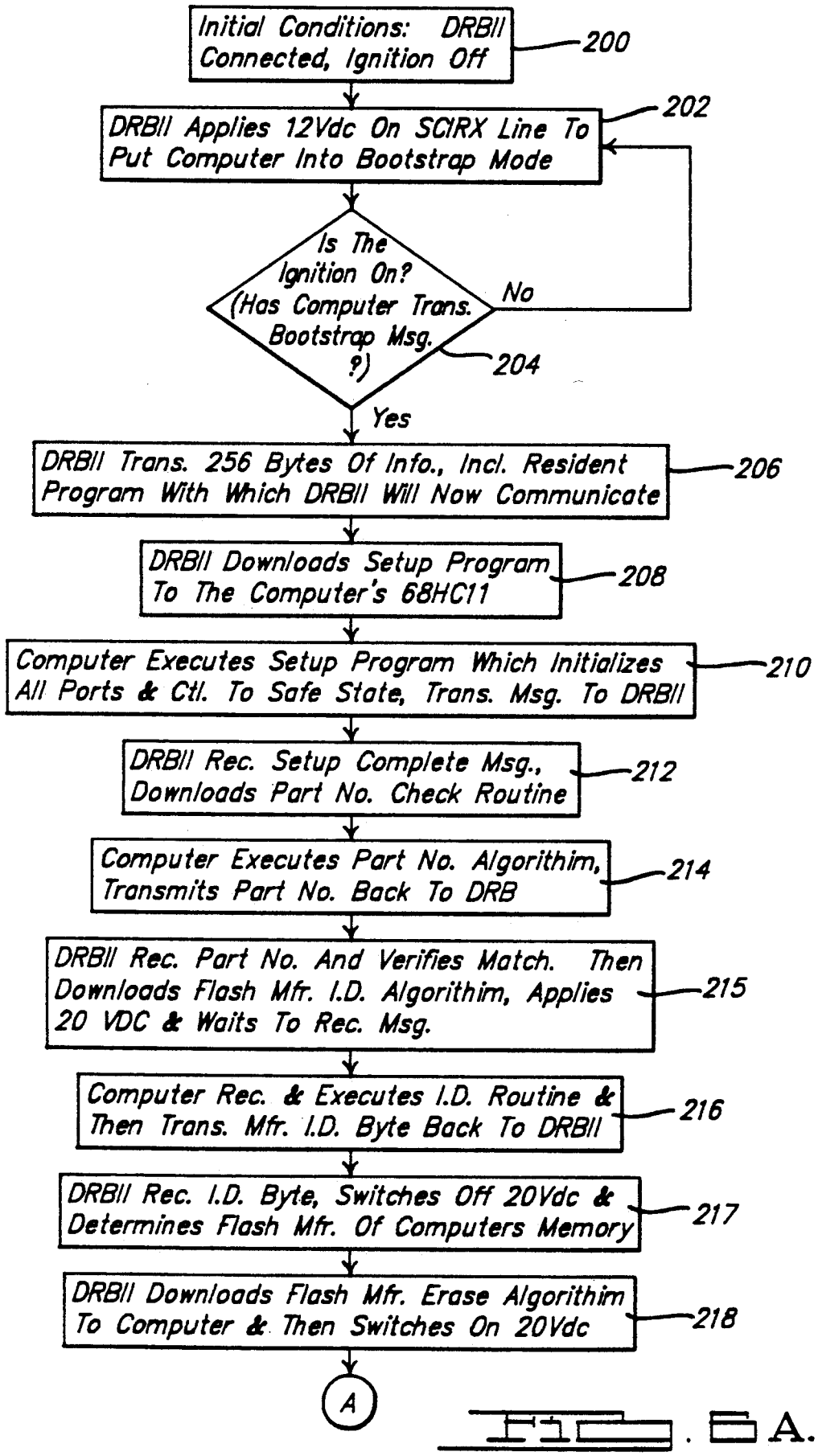
Figure 8B:
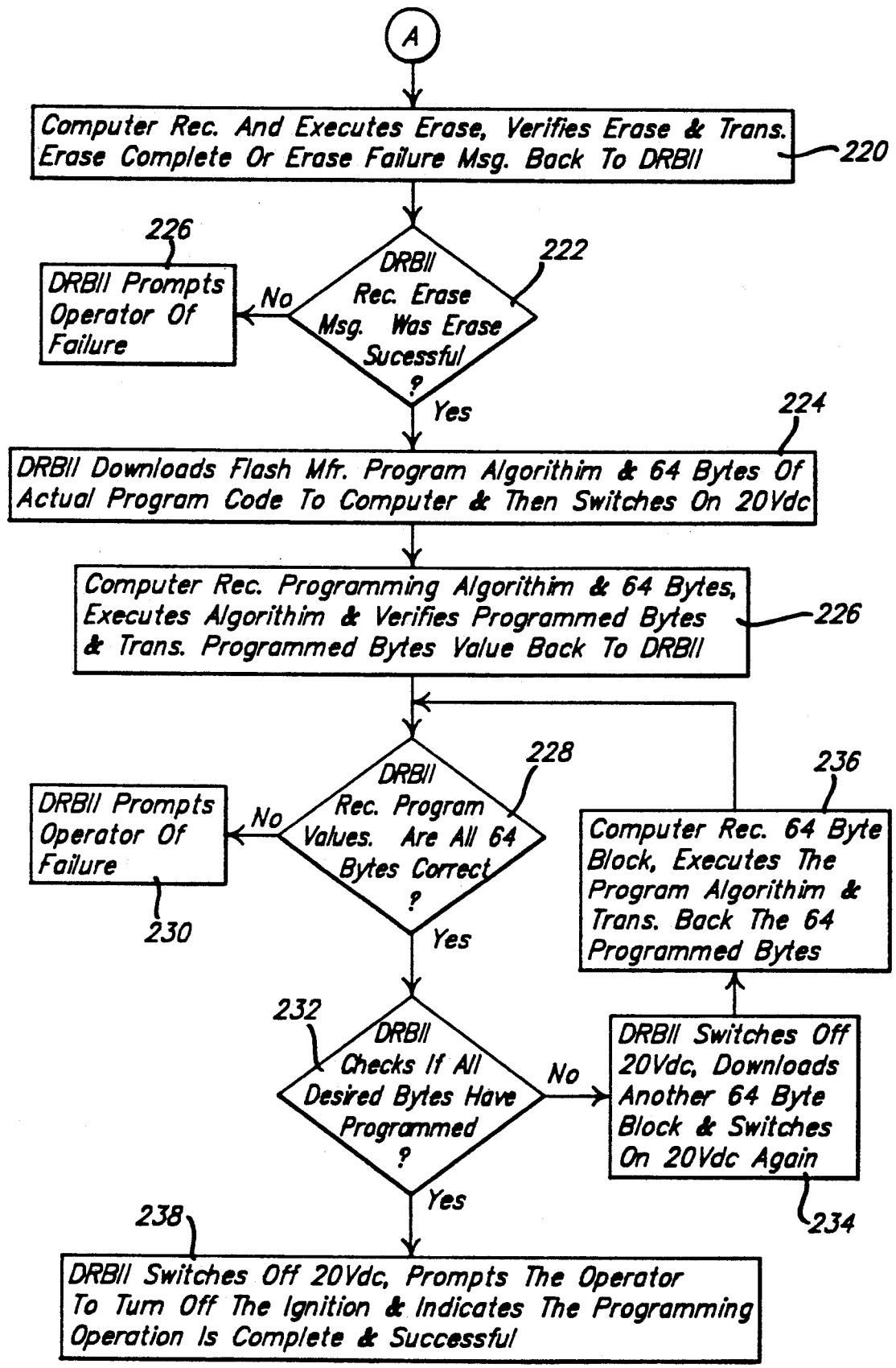

Referring to FIGS. 6A and 6B, a flow chart is presented which illustrates the methodology of the present invention in terms of the computer program instructions that are stored in the non-volatile memory 148 of the plug-in module 32. In this regard, the flow chart of FIGS. 6A-B is specifically directed to the process of reprogramming the flash memory chip Z179 in the engine controller 12. While there are variations in this methodology for the purpose of reprogramming the non-volatile memory in certain transmission controllers, these variations will be discussed after the preferred process for reprogramming the flash memory chip Z179 of the engine controller 12 has been described.

Block 200 of the flow chart refers to the initial conditions for the reprogramming process. In this regard, the diagnostic tool 28 (e.g. the DRB II unit) is connected to the vehicle 10 through the cable structure 30, and the engine ignition is off. For example, in the case of the DRB II unit, the technician will be prompted to turn off the ignition through a message transmitted from the computer circuit 152 to the display 42.

Block 202 indicates that the diagnostic tool 28 will apply the 12 volt bootstrap command signal to the SCIRX receive line shown in FIG. 2, in order to initiate the bootstrap mode. Then, the diagnostic tool 28 will prompt the technician to turn on the ignition, and it will wait for the transmission of a character from the microprocessor chip Z144 which will verify that the microprocessor is in the bootstrap mode. These two steps are represented by diamond 204 in FIG. 6A.

Once the bootstrap mode is verified, the diagnostic tool 28 will download a series of programs (one at a time) to the random access memory (RAM) within the microprocessor chip Z144 via the SCIRX receive line. As part of this process, each byte of the computer programs being sent to the vehicle will be echoed or transmitted back to the computer circuit 152 in the diagnostic tool 28 to verify the correct reception of the computer program instructions. In this regard, the SCITX transmit line shown in FIG. 2 is used by the microprocessor chip Z144 to echo back each computer word or byte to the computer circuit 152. It should also be noted that none of the computer programs used in the reprogramming operation are stored on-board the vehicle 10. This feature of the preferred method serves to enhance the security of the computer program instructions stored in the flash memory chip Z179 of the engine controller 12.

Block 206 indicates that the first computer program downloaded from the diagnostic tool 28 is a resident program. The resident program provides the instructions for enabling the microprocessor chip Z144 to receive, store and echo each byte of information independent of the initial bootstrap routine utilized at key on, as discussed above. Block 208 indicates that the next computer program to be downloaded is the setup program. The setup program is used to initialize the microprocessor chip Z144 and related on-board hardware controlled by the microprocessor chip Z144 for the reprogramming operation. Block 210 shows that the microprocessor Z144 will execute the setup program and transmit a message back to the diagnostic tool 22 that the initialization is complete.

Block 212 indicates that the diagnostic tool 22 will then transmit a part number program to the microprocessor chip Z144. The part number program is used to read the existing part number of the engine controller 12 from the flash memory chip Z179. Block 214 then shows that the part number program will be executed by the microprocessor chip Z144. As indicated by block 215 the diagnostic tool 28 will compare the part number received with its stored table of part numbers for which the reprogramming operation will be permitted. This feature of the present invention will insure that the proper plug-in module 32 is being used for the particular non-volatile memory chip contained in the on-board vehicle computer circuit. This feature of the present invention could also be used to avoid the need to reprogram the on-board non-volatile memory, where the memory device already has the most current version of the software stored in memory. If a part number match is not found from the engine controller part number stored in the flash memory chip Z179, the part number program will then read a predefined location in the internal EEPROM of the microprocessor chip Z144 to see if an acceptable part number has been stored in this location. As will be discussed below, the engine controller part number from the flash memory chip Z179 is temporarily stored in the internal EEPROM of the microprocessor chip Z144 prior to the step of erasing the contents of the flash memory chip Z179.

Block 215 also indicates that the identity of the manufacturer for the flash memory chip Z179 will be read next. In order to read this part identity, the diagnostic tool 28 will download the manufacturer I.D. routine and then cause the reprogramming command signal to be transmitted to the flash memory chip Z179 via the SCIRX receive line. Once the part identity number is received by the diagnostic tool 28, blocks 216-217 indicate that the reprogramming command signal will be turned off. This I.D. number is used to determine which erase and reprogramming algorithms should be sent to the microprocessor chip Z144, as these algorithms may vary with the specific manufacturer or generation of the flash memory chip Z179.

In one form of the present invention, it is preferred that the engine controller part number originally stored in the flash memory chip Z179 also be stored in the EEPROM memory of the microprocessor chip Z144 before the flash memory chip is erased. This provision is used to provide a temporary part identity reference in the event of a power loss or other program interruption during the erasure sequence. Once the engine controller part number has been stored, then the memory locations in the flash memory chip Z179 may then be erased. After the flash memory chip Z179 has been completely reprogrammed, then the temporary part number reference may be erased from the EEPROM memory of the microprocessor chip Z144.

Block 218 indicates that the algorithm required to erase the contents of the flash memory chip Z179 is downloaded from the diagnostic tool 28, and the reprogramming command signal is again transmitted to unlock the flash memory chip. Block 220 indicates that the erase routine will be performed in accordance with this algorithm, and diamond 222 indicates that the diagnostic tool 28 will wait for one of two messages from the microprocessor chip Z144. Specifically, if the erasure has been completed and verified, the program flow will continue on to reprogramming block 224. However, if the erasure operation was unsuccessful, then an error message will be transmitted, and block 226 shows that the diagnostic tool 28 will inform the technician of the failure via the display 42.

Block 224 indicates that the algorithm for storing new computer program code (e.g., instructions, data, pointers and the like) and the first 64 bytes of this code are downloaded from the diagnostic tool 28. The 20 volt reprogramming command signal is then transmitted to the flash memory chip Z179 in order to permit the chip to receive and store the new computer program code.

Block 226 indicates that the new computer program code will be transmitted and stored in packets of 64 bytes. As with the transmission of the reprogramming algorithms from the diagnostic tool 28, each packet of new computer program code will be echoed back to the diagnostic tool to verify the proper storage of these bytes in the flash memory chip Z179. In this regard, diamond 228 indicates that the diagnostic tool 28 will compare each of the transmitted bytes with the echoed bytes to insure that there is a correct match. If a correct match has not been found for any of the transmitted bytes, then a failure message will be conveyed to the technician via display 42 (block 230).

Diamond 232 and blocks 234-236 indicate that the diagnostic tool 28 will continue to send the rest of the new computer program code to the flash memory chip Z179 (through the microprocessor chip Z144) in an iterative, self-checking process. Specifically, blocks 234-236 indicate that the reprogramming command signal will be turned off before each packet of new computer program code is transmitted, then switched on after each packet has been transmitted, and then the computer circuit 152 in the diagnostic tool 28 will check to insure that each of the transmitted bytes of information in the packet has been successfully received and stored.

Finally, block 238 indicates that the reprogramming command signal will be turned off, and the diagnostic tool 28 will prompt the technician to turn off the ignition via display 42. The reprogramming process is now complete, and the diagnostic tool 28 may be disconnected from the vehicle 10 by unplugging the cable structure 30 from the diagnostic connector 22.

With respect to the process of reprogramming the non-volatile memories of other on-board vehicle computer circuits, the process may be the same or close to the preferred process described above for the engine controller 12. However, one factor which could cause a difference in the preferred process has to do with the communication rates provided by the diagnostic tool 28 and the particular on-board vehicle computer circuit whose non-volatile memory is to be reprogrammed. In this regard, the microprocessor chip Z144 has an internal bootstrap algorithm which sets up an initial SCI signal transfer protocol at a 7812.5 baud rate in the bootstrap mode. The baud rate is then reset to 62.5 kilobaud for the actual transmission of computer programs to the microprocessor chip Z144 from the diagnostic tool 28. These baud rates are determined at least in part by the clock speed of the microprocessor chip, and in this particular case, the generation of 68HC11 microprocessor chips used in the engine controller 12 have a clock rate of 2 MHz. The present generation of DRB II units also include a 68HC11 microprocessor in its computer circuit 152. Even though the clock rate of the microprocessor chip in the DRB II unit is 1 MHz, the initial SCI signal transfers are set for the 7812.5 baud rate. Accordingly, it should be appreciated that there is synchronization between the initial SCI baud rates for communication between the DRB II unit and the microprocessor chip Z144 in the engine controller.

However, an incompatibility between the communication baud rates could arise, for example, if the clock rate of the on-board vehicle computer circuit were changed. Specifically, if the clock rate of the 68HC11 microprocessor chip was increased to 3 MHz (i.e., a 50% increase), then the initial baud rate of the this on-board computer chip could also increase proportionally to 11,718.75 baud in the bootstrap mode. In this regard, certain transmission controllers 14 may employ such an increased clock rate. While the special test mode could be used in the place of the bootstrap mode as an initial step of the reprogramming process, since the special test mode could permit compatible baud rates, the special test mode of the microprocessor chip Z144 would not be as advantageous as the bootstrap mode. This is because the program needed by the microprocessor chip Z144 to permit initial communication with the diagnostic tool would have to be derived from the on-board EEPROM memory and loaded into the internal RAM memory of the microprocessor chip Z144. In contrast, the communication program for the bootstrap mode is contained in the internal ROM memory of the microprocessor chip Z144. Thus, if there was a loss of power during communication in the test mode, the ability to communicate with the diagnostic tool 28 would be lost, and the process would have to be restarted from the beginning.

Accordingly, it is preferred that the bootstrap mode still be utilized. If the microprocessor chip employed in the vehicle cannot communicate at the baud rate of the signals transmitted by the diagnostic tool 28, then the on-board microprocessor chip will interpret the incorrect baud rate as a command to execute a series of instructions from its on-board EEPROM memory which will adjust the microprocessor's baud rate to that supplied by the diagnostic tool. The microprocessor will then jump back to the normal bootstrap mode with the new baud rate, and the reprogramming process will proceed as described above.

Referring to FIG. 7, a perspective view of a wiring harness 300 is shown. The wiring harness 300 is designed to be used in connection with reprogramming the non-volatile memory of the transmission controller 14. Specifically, the wiring harness 300 is adapted to be coupled directly to the 60-way module connector of the transmission controller 14. This 60-way module connector is shown in FIG. 1 in connection with reference numeral 302. This is in contrast to the above-described technique for reprogramming the non-volatile memory of the engine controller 12, as the cable structure 30 is coupled to the diagnostic connector 22 of the vehicle 10. In this regard, the wiring harness 300 will replace a wiring harness of the cable structure 30, which is generally designated by reference numeral 304 in FIG. 1. In other words, the wiring harness 304 will be unplugged from the terminal J2 of the adapter 34, and a connector 306 of the wiring harness 300 will be coupled to the terminal J2 in its place.

Additionally, it should be noted that the wiring harness 300 includes a pair of battery chips 308-310, while the wiring harness 304 includes only one battery chip, namely battery chip 312 for the positive terminal of the battery 314. These battery chips and the wires attached thereto are used to provide the transmission of electrical power to the diagnostic unit 28.

The wiring harness 300 also includes a 60-way connector assembly 316 which is adapted to be plugged into the 60-way module connector 302 of the transmission connector. In this regard, it should be appreciated that a similar connector assembly of the signal transfer structure 16 will first have to be removed from the 60-way module connector 302 of the transmission controller 14. A bolt 318 is also provided on the connector assembly 316 to facilitate a secure connection with the 60-way module connector 302 of the transmission controller 14.

As generally illustrated in FIGS. 3 and 4, the wiring harness 300 provides the following signals to the adapter 34: EATX Trans., EATX Rec., Ign., Battery and Ground. In this regard, the EATX Trans. and EATX Rec. provide a serial communication link between the diagnostic unit 28 and the transmission controller 14. Additionally, it should be noted that two Ground signals are actually provided. One of these Ground signals represents the ground potential for the circuits and the other Ground signal represents the ground potential of the battery 314.

In order to make the circuit drawings more understandable, the values for the various components were not shown thereon. However, for sake of completeness, these component values are listed below in connection with each figure showing a schematic circuit diagram:

| FIG. 2 | |
|---|---|
| COMPONENT | VALUE |
| R263 | 10 k |
| C017 | 0.001 μF |
| Z180 | 74HC14 |
| D287 | 9.1 V |
| Q331 | 2N4403 |
| Z101 | 78L12AC |
| R092 | 10 k |
| R388 | 1 k |
| Q355 | 2N4401 |
| D132 | 5.1 V |
| C392 | 0.1 μF |
| R094 | 10 k |
| C013 | 0.001 μF |

FIG. 2 -continued

| COMPONENT | VALUE |
| --- | --- |
| R386 | 806 Ohm |
| D280 | 15 V |
| R385 | 1 k |
| R192 | 1 k |
| Q327 | 2N4401 |
| R364 | 1.5 k |
| C265 | 0.1 µF |
| Z101 | 78L12AC |
| C248 | 0.1 µF |
| R373 | 20 k |
| R374 | 15 k |
| Z135 | 74HC00 |
| Z181 | 74HC14 |

FIG. 4

| COMPONENT | VALUE |
| --- | --- |
| R13 | 1 k |
| R14 | 1 k |
| C13 | .001 µF |
| R12 | 5.1 k |
| R11 | 1 k |
| Q3 | 2N3904 |
| R15 | 3 k |
| R10 | 3 k |
| Q5 | VP0300M |
| D5 | 1N4004 |
| R1 | RXE030 |
| R16 | 27 k |
| R9 | 3.3 k |
| Q6 | 2N3904 |
| Q2 | VP0300M |
| R19 | 1 k |
| R17 | 400 k |
| Q1 | UN10LM |
| Q7 | 2N3904 |
| R18 | 1 k |
| R20 | 10 k |
| C11 | .001 µF |
| R8 | 1 k |
| R6 | 1 k |
| Q8 | 2N3906 |
| C12 | .001 µF |
| R7 | 300 Ω |
| C9 | .001 µF |
| D2 | 1N4004 |
| C1 | 1000 µF |
| C2 | 3300 pF |
| u2 | LM7812 |
| D4 | 1N4004 |
| C10 | .1 µF |
| C3 | 3300 pF |
| L1 | 100 µH |
| D1 | 1N5819 |
| U1 | MC33063A |
| R3 | 240 |
| R2 | .300 |
| C4 | 430 pF |
| C5 | .001 pF |
| R5 | 47 k |
| R4 | 3 k |
| C8 | 100 µF |
| C7 | .1 µF |
| C6 | 470 µF |

FIG. 5

| COMPONENT | VALUE |
| --- | --- |
| U1 | 74HC173 |
| U2 | 27C256 |
| U3 | 27C64 |
| U4 | 74HC573 |

The present invention has been described in an illustrative manner. In this regard, it is evident that those skilled in the art once given the benefit of the foregoing disclosure, may now make modifications to the specific embodiments described herein without departing from the spirit of the present invention. Such modifications are to be considered within the scope of the present invention which is limited solely by the scope and spirit of the appended claims.

What is claimed is:

1. A system for reprogramming a non-volatile memory of an on-board vehicle computer circuit, comprising:

portable control means for transmitting reprogramming signals to said on-board vehicle computer circuit, including a sequence of command signals for enabling said non-volatile memory to receive new computer program node, and software signals which represent said new computer program code to be stored in said non-volatile memory;

interface means associated with said on-board vehicle computer circuit for processing said sequence of command signals and transmitting a sequence of responsive signals to said portable control means, at least one of said responsive signals including an identification code, said portable control means checks said identification code in accordance with a predetermined transfer protocol to determine if said new computer code should be transmitted to the on-board vehicle computer circuit; and signal transfer means for providing a communication link between said portable control means and said on-board vehicle computer circuit, said signal transfer means including a common data communication path for transmitting said sequence of command signals and said software signals which represent said new computer program code.

2. The system according to claim 1, wherein said reprogramming signals include a set of predetermined command signals including a first predetermined command signal for causing the erasure of at least a portion of the existing contents of said non-volatile memory prior to the transmission of said software signals to said on-board vehicle computer circuit.

3. The system according to claim 1, wherein said portable control means is comprised of a diagnostic tool which includes a portable housing, an off-board computer circuit contained in said portable housing, and a plug-in memory module which is removably secured to said portable housing, said plug-in memory module having non-volatile memory chip means connected to said off-board computer circuit for storing said new computer code.

4. The system according to claim 1, wherein said non-volatile memory of said on-board vehicle computer circuit comprises at least one flash memory chip.

5. The system according to claim 2, wherein said system includes switchable regulator circuit means for causing a selective one of said sequence of command signals to have a voltage level which exceeds any of the power supply voltage levels available on-board a vehicle.

6. The system according to claim 5, wherein said switchable regulator circuit means is contained in an adapter which forms part of said signal transfer means.

7. The system according to claim 6, wherein said voltage level of said selective one of said sequence of command signals exceeds fifteen volts.

8. The system according to claim 1, wherein said interface means includes threshold circuit means for detecting at least one of said sequence of command signals and transmitting an unlocking signal to said non-volatile memory.

9. The system according to claim 1, wherein said signal transfer means provides a separate serial communication link between said control means and each of a plurality of on-board vehicle computer circuits.

10. A method of reprogramming a non-volatile memory of an on-board vehicle computer circuit with new computer program code, comprising the steps of:

establishing a common communication link between said on-board vehicle computer circuit and an off-board controller having said new computer program code;

transmitting a sequence of command signals from said off-board controller to said on-board vehicle computer circuit over said common communication link for enabling said non-volatile memory to receive said new computer program code;

processing said sequence of command signals by said on-board vehicle computer circuit and transmitting a sequence of responsive signals to said off-board controller over said common communication link, at least one of said responsive signals including an identification code;

processing said responsive signals by said off-board controller in accordance with a predetermined transfer protocol which checks said identification code to determine if said new computer program code should be transmitted to said on-board vehicle computer circuit; and transmitting said new computer program code from said off-board controller to said on-board vehicle computer circuit over said common communication link when permitted under said predetermined transfer protocol, and storing said new computer program code in said non-volatile memory.

11. The method according to claim 10, wherein said sequence of command signals includes a signal for causing the erasure of at least a portion of the existing contents of said non-volatile memory.

12. The method according to claim 11, wherein said identification code identifies the existing computer program code in said non-volatile memory.

13. The method according to claim 11, wherein said sequence of command signals includes a command signal having a voltage level which exceeds the voltage level of any power supply present on-board a vehicle.

14. The method according to claim 10, wherein said common communication link is established through a pair of serial communication lines to which said on-board vehicle computer circuit is connected.

15. The method according to claim 11, wherein said non-volatile memory is comprised of at least one flash memory chip and substantially the entire contents of said flash memory chip are erased before said new computer program code is transmitted.

16. The method according to claim 13, wherein said sequence of command signals includes a first command signal which causes said on-board vehicle computer circuit to initialize a bootstrap mode.

* * * * *